(12) United States Patent
Berkcan et al.

(10) Patent No.: US 8,368,380 B2
(45) Date of Patent: Feb. 5, 2013

(54) DEVICES AND METHODS FOR ELECTRIC FIELD SENSING

(75) Inventors: Ertugrul Berkcan, Clifton Park, NY (US); David William Vernooy, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 363 days.

(21) Appl. No.: 12/751,796

(22) Filed: Mar. 31, 2010

(65) Prior Publication Data

US 2011/0241648 A1   Oct. 6, 2011

(51) Int. Cl.
*G01R 19/00*   (2006.01)

(52) U.S. Cl. ............... 324/76.11; 324/530; 324/246; 324/247; 257/25; 257/E29.192; 257/29.34

(58) Field of Classification Search .......... 324/72, 324/76, 530, 207, 304, 457, 458, 76.11, 246, 324/247; 257/25, E29.192, 29.34, E33.069, 257/E21.367, E21.395

See application file for complete search history.

(56) References Cited

U.S. PATENT DOCUMENTS

| | | | | | |
|---|---|---|---|---|---|
| 4,853,753 | A | * | 8/1989 | Capasso et al. | 257/25 |
| 4,861,990 | A | * | 8/1989 | Coley | 850/1 |
| 5,012,318 | A | * | 4/1991 | Honjo | 257/195 |
| 5,198,879 | A | * | 3/1993 | Ohshima | 257/20 |
| 5,834,793 | A | * | 11/1998 | Shibata | 257/25 |
| 5,880,484 | A | * | 3/1999 | Park et al. | 257/25 |
| 7,227,142 | B2 | | 6/2007 | Parker | |
| 7,378,837 | B2 | | 5/2008 | Andarawis et al. | |
| 2002/0119591 | A1 | * | 8/2002 | Schulman | 438/91 |
| 2002/0175273 | A1 | | 11/2002 | Moddel et al. | |
| 2007/0120553 | A1 | * | 5/2007 | Andarawis et al. | 324/126 |
| 2009/0051452 | A1 | * | 2/2009 | Asada et al. | 331/107 T |
| 2009/0184783 | A1 | * | 7/2009 | Park et al. | 333/219.2 |
| 2010/0026400 | A1 | * | 2/2010 | Koyama et al. | 331/107 T |
| 2010/0058499 | A1 | * | 3/2010 | Shigeno | 850/21 |

FOREIGN PATENT DOCUMENTS

JP    1111347 A    4/1989

OTHER PUBLICATIONS

Hartnagel, "Modulation of Quantum-Electronic Devices by Bending of Special MEMs Structures"; National Institute for Research and Development in Microtechnologies, 2004 IEEE, p. 19-27.

(Continued)

*Primary Examiner* — Huy Q Phan
*Assistant Examiner* — Thang Le
(74) *Attorney, Agent, or Firm* — Marie-Claire Maple (57) ABSTRACT

A stand-off sensor assembly is provided. The sensor assembly includes a plurality of electron state definers for generating resonant tunneling current in response to the electric field, wherein the electron state definers include at least one variable characteristic such that a change in the variable characteristic affects the tunneling current, and a monitor for monitoring a change in the tunneling current exiting an electron state definer based on a change in the variable characteristic of the tunneling device.

24 Claims, 8 Drawing Sheets

OTHER PUBLICATIONS

D. Dilella; L. J. Whitman; R. J. Colton; T. W. Kenny; W. J. Kaiser; E. C. Vote; J. A. Podosek and L. M. Miller; "A Micromachined Magnetic-Field Sensor Based on an Electron Tunneling Displacement Transducer"; © 2001-2010 Storming Media LLC. All rights reserved; 2 Pages; url:http://www.stormingmedia.us/22/2221/A222184.html.

Yeh C and Najafi K; "A low-voltage tunneling-based silicon microaccelerometer"; Name and Date: Electron Devices, IEEE Transactions on Publication Date: Nov. 1997vol. 44, Issue: 11; Current Version Published: Aug. 6, 2002; Sponsored by: IEEE Electron Devices Society; 3 Pages.

A. Audzijonis, R. Sereika, V. Lapeika and R. Altauskas; "Current mechanism in SbSeI crystals based on phonon-assisted tunnelling emission"; Name and Date: Aug. 10, 2006; Revised: May 3, 2007; Accepted: May 9, 2007; 4 Pages.

"Quantum Electron Tunneling Sensor"; Contact Information—Cheng-Hsien Liu (liuch@pme.nthu.edu.tw) and Tom Kenny (kenny@cdr.stanford.edu); 6 Pages; http://memsliu.pme.nthu.edu.tw/MSCL%20Projects/Tunneling_Sensor.htm; retrieval date Mar. 4, 2010.

* cited by examiner

DEVICES AND METHODS FOR ELECTRIC FIELD SENSING

BACKGROUND

Embodiments of the invention relate to the field of electric field sensing, and more particularly to resonant tunneling based electric field sensors and methods of making and using the same.

Stand-off sensing of an electric field may be required in certain applications. For example, non-invasive sensing may be required so that the electric field is not disturbed by the presence of an external body (sensing device). In one example application, the electric field to be sensed may be in a range from about 10 microvolt per meter to about 100 microvolts per meter at a stand-off distance of about 1 cm. Application specific frequency ranges may be in a range from about 0.5 Hz to about 30 Hz with bandwidth bins of about 5 Hz.

Conventional approaches to stand-off electric field sensing include optical approaches, capacitive approaches and approaches employing a superconducting quantum interference device (SQUID). SQUID requires cryo-cooling, hence, is not considered viable from a monetary and space point of view. Optical approaches for stand-off electric field sensing rely on electro-optic effects. Optical devices for such optical approaches can meet sensitivity requirements, however, these optical devices face challenges with regard to packaging requirements from a size, weight and cost perspective. Capacitive approaches provide a global optimum with respect to stand-off distance, however, disadvantageously, the capacitive devices, such as capacitive sensors suffer from low frequency electronic noise.

Accordingly, there is a need for stand-off electric field sensing devices that have reasonable sensitivity and are easy to package.

BRIEF DESCRIPTION

In one embodiment, a stand-off sensor assembly is provided. The sensor assembly includes a plurality of electron state definers for generating resonant tunneling current in response to the electric field, wherein the electron state definers include at least one variable characteristic such that a change in the variable characteristic affects the tunneling current, and a monitor for monitoring a change in the tunneling current exiting an electron state definer based on a change in the variable characteristic of the tunneling device.

In another embodiment, a system for sensing a parameter representative of an electric field is provided from a stand-off distance. The system includes a sensor assembly having a resonant tunneling device to generate resonant tunneling current modulated by the electric field, wherein the resonant tunneling device includes a variable characteristic, such that a change in the variable characteristic affects the tunneling current, a monitor that monitors a change in the tunneling current exiting the resonant tunneling device based on a change in the variable characteristic of the tunneling device, a modulator that modulates the variable characteristic of the resonant tunneling device, and an actuator in communication with the modulator that enables the change in the variable characteristic of the resonant tunneling device.

In yet another embodiment, a method for sensing, from a stand-off distance, a parameter representative of an electrical field is provided. The method includes generating a resonant tunneling current using a resonant tunneling device in response to the electric field, modulating the tunneling current by varying at least one variable characteristic of the resonant tunneling device, and monitoring a change in the tunneling current exiting the resonant tunneling device based on a change in the variable characteristic of the tunneling device to determine the parameter representative of the electrical field.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

In certain embodiments, a sensor assembly for sensing an electric field from a stand-off distance is provided. In certain embodiments, the sensor assembly functions on the principles of resonant tunneling. Resonant tunneling results in a substantial increase in the sensitivity of the detection of the electric field. In one embodiment, tunable resonant tunneling may be used for high-sensitivity, and high-resolution electric field sensing. Further, due to the stand-off sensing methods employed for sensing the electric field, the sensor assembly of the present invention has minimal or no negative impact on the magnitude of the electric field and/or direction of the current that is representative of the electric field being sensed. For example, sensing the current using the sensor assembly described herein does not introduce or cause any appreciable variation or change in the electric field being sensed. In certain embodiments, a stand-off sensor assembly comprises a plurality of electron state definers for generating resonant tunneling current in response to the electric field being sensed. The plurality of electron state definers comprises at least one variable characteristic such that the change in the variable characteristic affects the resonant tunneling current. Non-limiting examples of the variable characteristic include a bandgap thickness, a material thickness, or a gap distance. Further, the stand-off sensor assembly includes a monitor for monitoring a change in the tunneling current exiting the electron state definer based on a change induced in the variable characteristic of the electron state definers.

In certain embodiments, the size of the sensor assembly including the electron state definers may be a few centimeters. In some embodiments, the size of the electron state definers may be a few hundreds of microns (such as, from about 200 microns to about 600 microns) to a few millimeters (such as, from about 1 millimeter to about 3 millimeters), maintaining a small size of the sensor assembly facilitates sensing of the electric field in applications where space is limited. In addition, the structure of the electron state definers enables sensing of electric fields having strengths as low as 100 micro volts/meter.

To more clearly and concisely describe the subject matter of the claimed invention, the following definitions are provided for specific terms, which are used in the following description and the appended claims.

As used herein, the term "stand-off detection" refers to a non-contact detection or detection without physical or electrical contact of the sensor with a body in which the electric field is being sensed or detection in which the sensor does not appreciably disturb the detection volume. In one example, stand-off detection may include a non-invasive detection.

A used herein, the term "stand-off distance" refers to a distance between the stand-off sensor assembly and the body in which the electric field is being sensed.

As used herein, the term "non-invasive detection" refers to a detection procedure that does not penetrate a body in which electric field is being sensed. For example, non-invasive detection may be performed by disposing a sensor on an outer case (such as skin) of a body (without any penetration of the outer case) in which the electric field is being sensed. In one example, a non-invasive detection may be a stand-off detection As used herein, the term "heterojunction" encompasses an interface that occurs between two layers or regions having dissimilar crystalline semiconductor materials.

As used herein, the term "tunable" refers to the ability of varying the shape and size of the energy barrier of the electron state definers. For example, a gap distance of a resonant tunneling device may be modulated to change a thickness of the energy barrier corresponding to an electron state definer of the resonant tunneling device to enable occurrence of resonant tunneling effect.

In quantum tunneling through a single barrier, the transmission coefficient, is less than one (for incoming particle energy less than the potential barrier height). In a potential profile, which contains two barriers located close to each other that form a quantum well, the transmission coefficient is expressed as a function of the incoming particle energy. In general, a quantum well, is a potential structure, which spatially confines the electron. Resonance in the transmission coefficient of the incoming particle energy occurs at certain incident electron energies. The electron transmission coefficient through a structure is sharply peaked at these certain incident energies. For electrons with an energy corresponding approximately to the virtual resonant energy level of the quantum well, the transmission coefficient is close to unity. For these incident electron energies, the transmission coefficient is equal to one, i.e., the double barrier is transparent for particle transmission. That is, an electron with this resonant energy (for which the transmission coefficient is close to unity) can cross the double barrier without being reflected. This phenomenon is called resonant tunneling. That is to say, while the transmission coefficient of a potential barrier is always lower than one (and decreases with increasing barrier height and width), two barriers in a row can be completely transparent for certain energies of the incident particle. In certain embodiments, the two electron state definers are used to create the two energy barriers or the potential well. At particular values of the energy of the incident electrons, and energy of the energy barriers, the resonant tunneling current passes through the electron state definers. The value of this resonant tunneling current is used by the sensor assembly to calculate the electric field.

In certain embodiments, a mechanically modulated resonant tunneling approach is employed. Advantageously, quantum mechanical resonant tunneling provides high sensitivity, wide bandwidth electric field detection. The resonant tunneling results in a dramatic increase of the sensitivity to the electric field and effectively results in an amplification effect on the detection. In addition, mechanical modulation of the gap to move the signal out of band and away from noise sources like the flicker (1/f) noise dramatically reduces the fundamental noise of the detector. The combined effect of the mechanically modulated resonant tunneling is to largely increase the signal while the noise is being reduced resulting in highly increased signal-to-noise ratio.

Figure 1:
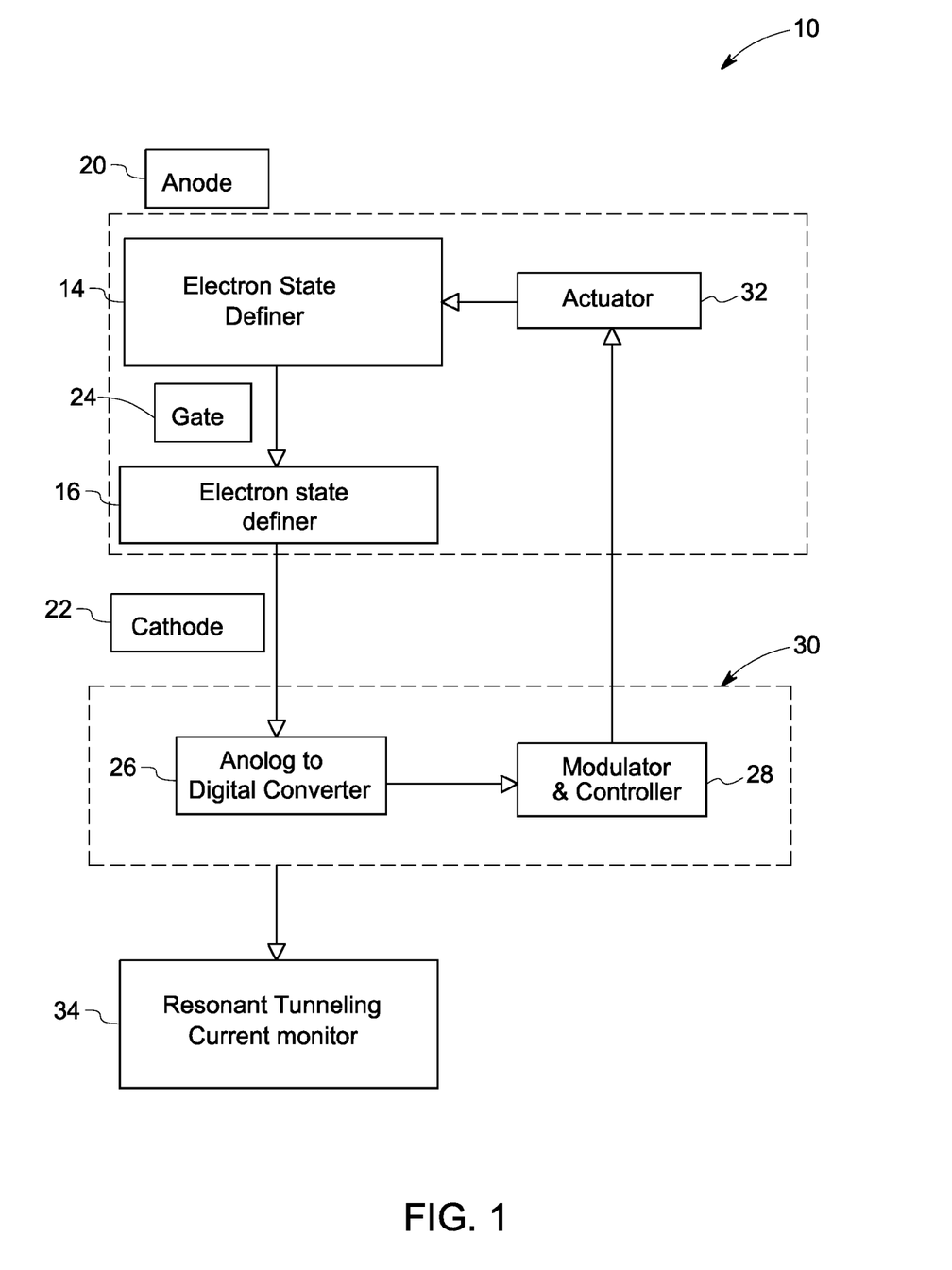
FIG. 1 is a schematic diagram representative of an example of a detection system employing a sensor assembly, in accordance with embodiments of the present technique.

FIG. 1 illustrates one embodiment of system architecture for detection system 10 having a stand-off sensor assembly stand-off for detection of an electric field. The sensor assembly includes two electron state definers represented by reference numerals 14 and 16. The electron state definers 14 and 16 together form a resonant tunneling device. Each of the electron state definers 14 and 16 creates a corresponding energy barrier in the band structure. The electron state definers 14 and 16 create a dual energy barrier for approaching electrons, such that the electrons are generally not able to pass through one or both of the energy barriers. However, in the presence of an electric field, the energy barriers corresponding to the electron state definers 14 and 16 may be modified to permit transmission of electrons, thereby generating a resonant tunneling current. The resonant tunneling current thus produced is representative of the electric field that is being sensed.

Figure 2A:
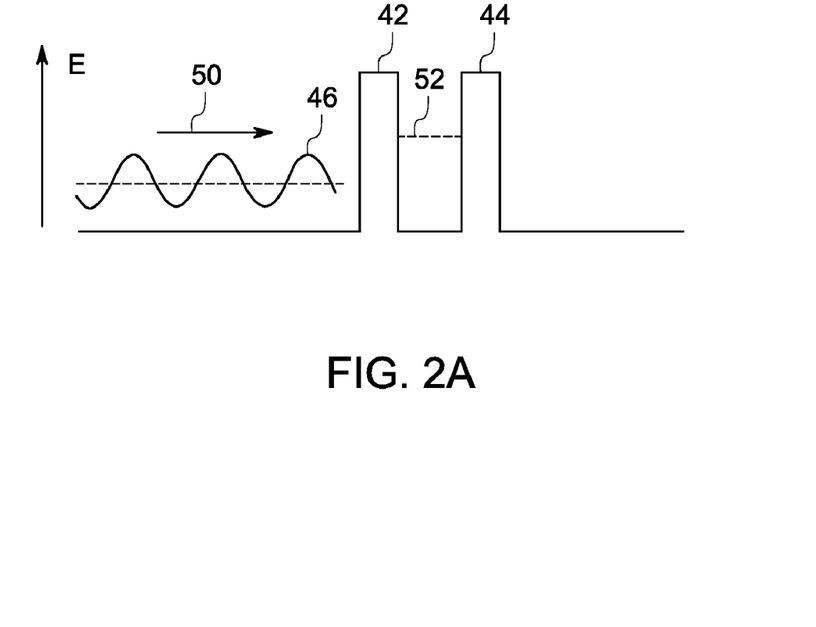
FIGS. 2A-2B are schematic representations of resonant tunneling principle showing an effect of the electric field on the energy bands.
Figure 2B:
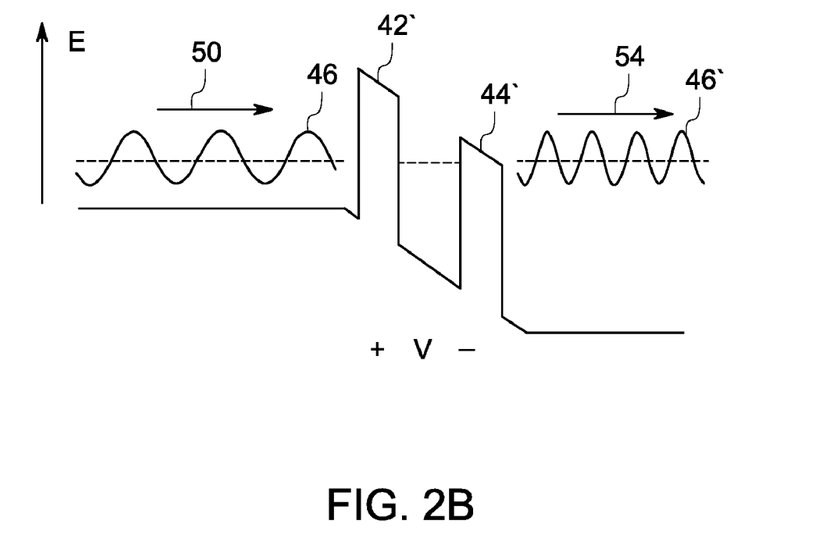

Referring now to FIGS. 2A and 2B, an energy diagram for the electron state definers is illustrated. Each of the electron state definers 14 and 16 creates a separate forbidden energy area or energy barrier. In the presently contemplated embodiment, the energy barrier 42 corresponds to the electron state definer 14, and the energy barrier 44 corresponds to the electron state definer 16. In the presence of an electric field, the energy bands of the electron state definers 14 and 16 are bent such that a resonant tunneling current passes from one electron state definer to another. The two forbidden areas 42 and 44 may or may not be identical depending on the properties of the corresponding electron state definers (such as electron state definers 14 and 16 of FIG. 1). The particle represented by the wave-like formation 46 approaches the first forbidden area 42 as represented by the arrow 50. Depending on the energy of the wave 46, the particle may or may not be able to transmit through the energy barrier 42. Even if the electron is able to transmit through the first energy barrier 42 (as represented by the dotted line 52), the probability of the particle passing through the second barrier 44 is relatively low. Hence, there is usually no tunneling current in the presence of two closely disposed energy barriers, such as barriers 42 and 44. However, in the presence of an electric field, for a given frequency (energy of electron), the electron is able to tunnel through (as illustrated by arrow 54, and wave 46') both the energy barriers 42 and 44 due to the bending of the energy barriers 42 and 44 (42' and 44', respectively), and/or a change in shape (height or width) of the one or both energy barriers 42 and 44. As a result, a resonant tunneling current is produced.

With a returning reference to FIG. 1, the electron state definers 14 and 16 may be a gap, or a heterojunction. In one embodiment, one electron state definer, such as the electron state definer 14 may be a gap, and the other electron state definer, such as the electron state definer 16 may be a heterojunction (see e.g., FIG. 3). In another embodiment, both the electron state definers 14 and 16 may be heterojunctions (see e.g., FIG. 4). Non-limiting examples of heterojunctions may include a metal-insulator, metal barrier, layers of semiconducting materials, layers of conducting materials, layers of metallic material, layers of insulating material, and layers of a fast ion conductor.

The system 10 further employs an electrode structure that includes an anode 20, a cathode 22, and a gate 24. In order to optimize operating parameters such as the resonant tunneling current, electrode materials should exhibit very low energy barrier(s) for electron emission while remaining structurally and chemically stable. Non-limiting examples of the electrode materials may include metal (e.g., gold, platinum), and materials with a low work function (such as alloys of cerium or gold).

In addition to low energy barrier(s), it is desirable to have compact electrodes (such as anode 20, cathode 22 or gate 24) to enable a smaller size of the sensor assembly. In addition to compact size, low parasitic capacitance helps maximize the bandwidth of the assembly 12. In one embodiment, the electrodes 20, 22 and/or 24 may include a capacitive design, or an antenna-like design.

The electronics generally represented by reference numeral 30 processes raw analog current from the resonant tunneling device through a combination of amplifier (not shown), demodulator (not shown), and analog-to-digital converter 26, and an electron state definer modulator and controller 28. The modulator and controller 28 may initially search and subsequently lock into the maximum signal strength in an analogous fashion to a phase lock loop (PLL) in communication systems. In one embodiment, a lock-in modulator may have several modes to test different algorithms of varying levels of complexity. For example, the modulator and controller 28 may include open loop scanning phase lock loop (PLL). By integrating the modulator and controller 28 into the electronics 30, control lag may be minimized by providing at least some control in the analog signal processing space.

The modulator and controller 28 may be used to modulate a variable characteristic of at least one electron state definer. The modulator and controller 28 may modulate the variable characteristic using an actuator 32. In one example, the variable characteristic may include a gap distance. The actuator 32 may be an acoustic actuator, an electric actuator, a magnetic actuator, a capacitive actuator, a piezo-electric actuator, a thermal actuator, a shape memory alloy based actuator, or combinations thereof.

The actuator 32 receives signals/instructions from the modulator and controller 28 to carry out the desired change in the variable characteristic of the electron state definers 14 and/or 16. In one example, the modulator and controller 28 may modulate the variable characteristic to maintain a resonant tunneling current between the two electron state definers 14 and 16. In addition to maintaining the resonant tunneling current, in one embodiment, the modulator and controller 28 may also be used for monitoring the resonant tunneling current. Optionally, the modulator and controller 28 may include a comparator (not shown) to compare between the tunneling current and/or the variable characteristic. Based on a comparison between the tunneling current and/or the variable characteristic, the modulator may further modulate the variable characteristic of the electron state definers 14 and 16, and hence further optimize the tunneling current. In this embodiment, the modulator and controller 28 may include or may be in operative association with a resonant tunneling current monitor 34 for monitoring the resonant tunneling current.

In certain embodiments, the resonant tunneling current monitor 34 is configured for high accuracy current sensing, and comprises ultra low noise electronics. In one embodiment, one or more functionalities of the analog-to-digital converter 26 may be built in to the resonant tunneling current monitor 34. For example, the resonant tunneling current monitor 34 may be configured to perform a plurality of functions, including a combination of amplification, demodulation, and analog-to-digital conversion. In one embodiment, the monitor and associated electronics may be disposed in a low noise, compact package. In one embodiment, the resonant tunneling current monitor 34 may include ultra-low noise charge sensitive integrators having high input impedance, tunable bandwidth, and low frequency noise reduction techniques. In this embodiment, the resonant tunneling current monitor 34 may also include modulators, demodulators, precision references and control circuits to actively tune the gap of the resonant tunneling In certain embodiments, an active tunneling approach may be employed when the energy barrier is tunable. The electron state definers may employ either a 2-terminal device, or a 3-termincal device, or both. Typically, 2-terminal devices such as Schottky, or metal/double-insulator/metal based tunneling diodes, are passive devices that have a fixed gap. In contrast, 3-terminal devices such as high electron mobility transistors and micro-electromechanical systems (MEMS) based devices are active devices that have the ability to dynamically control the gap. Both active and passive types of devices offer the possibility for integration with signal conditioning electronics and arraying in a multi-sensor format. Advantageously, passive devices offer relative processing simplicity. On the other hand, the active devices include noise reduction by modulation, impedance control, and substantially increased tunneling probability leading to increased sensitivity.

Figure 3:
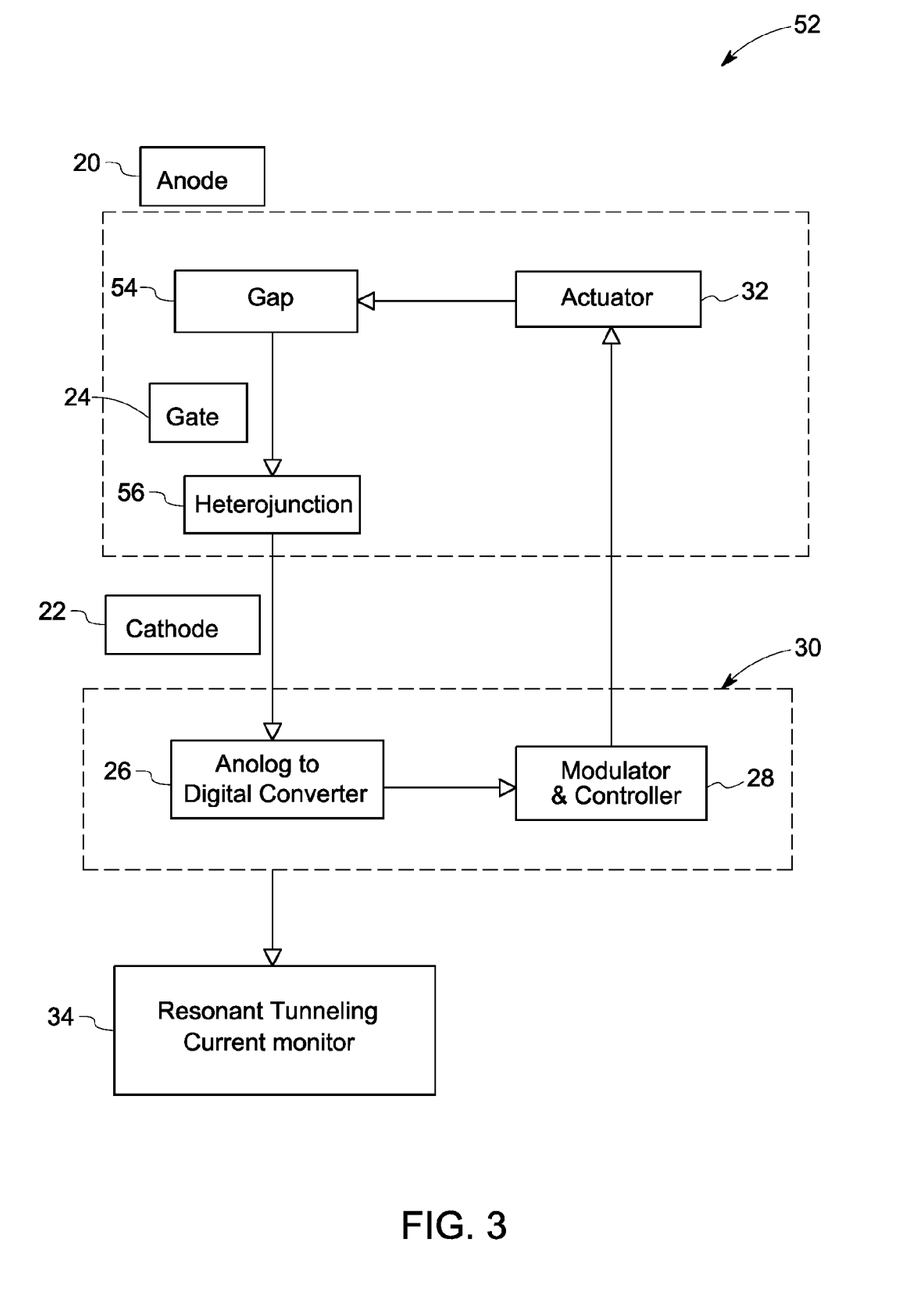
FIG. 3 is a schematic diagram representative of an example of a sensor assembly employing a gap and a heterojunction, in accordance with embodiments of the present technique.

Turning now to FIG. 3, a stand-off sensor assembly 52 includes a resonant tunneling device having a gap 54 and a heterojunction 56. The gap 54 forms an energy barrier that may be tuned to be in resonance with the energy barrier of the heterojunction 56 to allow resonance tunneling current. Non-limiting examples of the gap includes a vacuum gap, a dielectric gap, a multilayer gap, or combinations thereof. In an embodiment where the gap 54 represents a multilayer gap, the gap may include a plurality of layers that include a metallic material, an insulating material, a fast ion conductor, a semiconductor material, or combinations thereof. The plurality of layers of the multilayer gap may include an amorphous material, or a crystalline material. In one embodiment, the multilayer gap may include an emitter surface, a collector surface, or both. The multilayer gap may also include a conducting intermediate layer. In one embodiment, the gap distance may be in a range from about 5 nanometers to about 20 nanometers. In another embodiment, the gap distance may be in a range from about 3 nm to about 10 nm.

Figure 4:
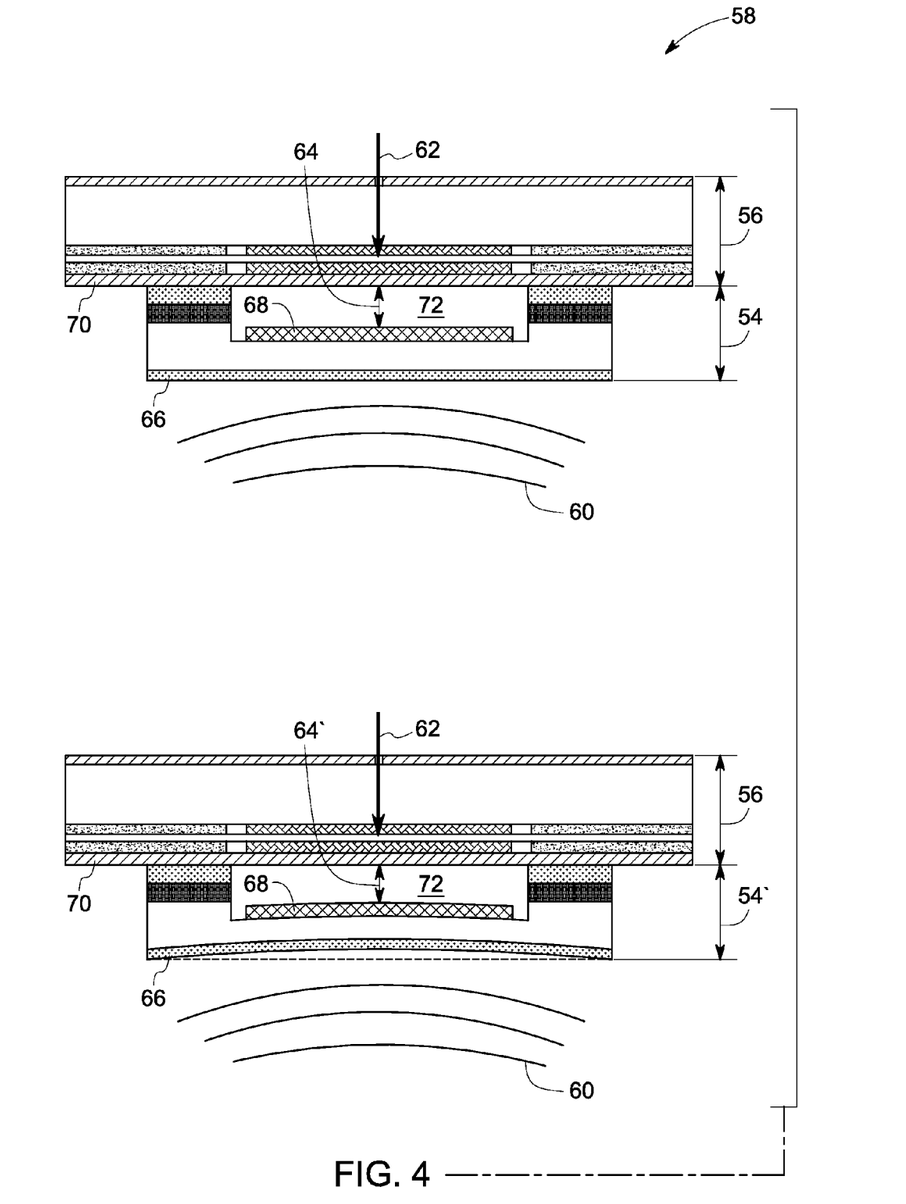
FIG. 4 is a cross-sectional view of a resonant tunneling device of the sensor assembly of FIG. 3.

As illustrated in more detail in FIG. 4, the resonant tunneling device 58 comprises the gap 54 and the heterojunction 56 as described with respect to FIG. 3. A variable characteristic of the resonant tunneling device 58 is a controllable gap distance 64 of the gap 54. In the illustrated embodiment, the gap 54 is in a series connection with the heterojunction 56. In the presence of the electric field 60, the energy bands of the gap 54 and the heterojunction 56 are bent. In addition, a modulation in the gap distance 64 modifies the energy barrier corresponding to the gap 54. The combined effect of the presence of electric field and modification of a gap distance 64 (variable characteristic) results in a resonant tunneling current passing from the gap 54 to the heterojunction 56. The resonant tunneling current 62 is a direct indicator of the electric field 60 in which the sensor assembly 52 is disposed. This resonant tunneling current 62 is dependent on the thickness or distance 64 of the gap. In contrast to conventional resonant tunneling, the gap distance may be modulated to maximize signal-to-noise ratio. For example, the resonant tunneling current may increase for a particular value of the gap distance 64. As illustrated, the gap distance 64 may be modulated/tuned by displacing at least a portion of the diaphragm 66. In the illustrated embodiment, the gap 54 is defined by two layers 68 and 70. In certain embodiments, the layer 68 may include an evaporated metal layer, and the layer 70 may include a highly doped silicon layer that is electrically conductive. The insulator used in between these two layers is a vacuum 72. In the presently contemplated embodiment, the displacement of the diaphragm 66 causes a shift in the layer 68 with respect to layer 70, thereby causing a change in the gap distance 64. A change in the gap distance 64 results a shift in the energy barrier to enable a flow of resonant tunneling current in the heterojunction 56 and the gap 54.

Advantageously, in some embodiments, the resonant tunneling device is configured to operate at frequencies above 1 GHz analogous to resonant tunneling diodes which are conventionally the preferred designs for high frequency operation of semiconductor devices.

In one embodiment, the gap may be a central barrier in the resonant tunneling device formed of a gap and a heterojunction. In another embodiment, the gap may be a top or a bottom barrier. As will be appreciated, the electron wave function decays in the barriers and modulation of the gap barrier width on the extreme ends of the device may not change the electron wave function enough to change the eigenvalues of the quasi-bound states. Accordingly, in the case of the structure having the gap in the middle of the resonant tunneling device, the tuning of the quasi-bound-state energies may be more sensitive to the gap size as compared to the case when the gap is either the first or third barrier, resulting in enhanced tunability and ease of fabrication.

Figure 5:
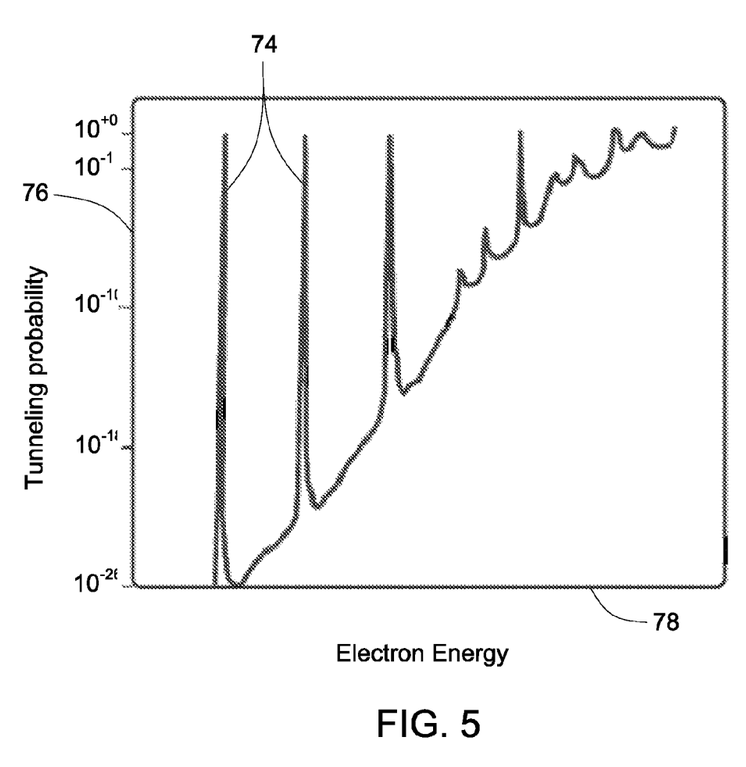
FIG. 5 is a graphical representation of resonant tunneling for a band gap structure of the resonant tunneling device of FIG. 3.

A resonant tunneling emitter quantum-mechanically coupled to a gap significantly increases the current level as compared to a Fowler-Nordheim field emitter as illustrated in FIG. 5. In addition, an almost mono-energetic distribution of the emitted electrons produces well-resolved oscillations of the tunneling current as a function of an electric field to be sensed, and a value of a variable characteristic, such as a gap thickness. Effectively, the intermediate states in the energy band enhance transport when the energy of the system is resonant with that of the intermediate states. In addition, the position of tunneling peaks depends on the variable characteristic, such as a gap thickness. Consequently, tuning of the peaks (74) is achieved by varying the gate potential (bias). The width of tunneling probability (ordinate 76) increases for higher electron energy (abscissa 78) and smaller work function and, conversely, decreases with increasing the bandgap thickness, material thickness (for examples, of heterojunctions layers), or a gap distance.

In the illustrated embodiment, the gap distance is actively controlled to tune the resonant tunneling to move the operation of the device to one of the peaks. In addition to the ability to modulate noise, the tunable gap obviates the need to address impedance matching. The advantages of a passive device include using electronic modulation to mitigate the effects of low frequency (1/f) noise. This has the effect of moving the baseband away from the 1/f noise regime by synchronous demodulation of the output after amplification.

Figure 6:
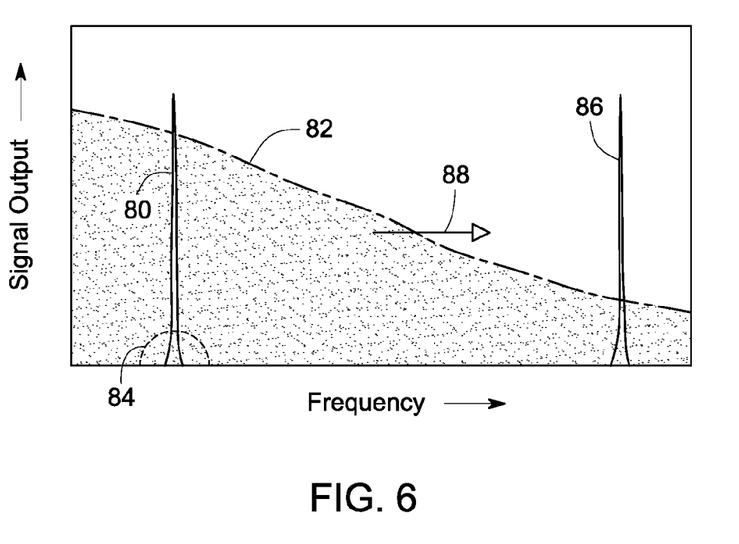
FIG. 6 is a diagrammatic representation of a shift in the signal due to modulation of the variable characteristic of the resonant tunneling device.

Advantageously, in the arrangement of the sensor assembly of the present technique, the variable characteristic can be varied mechanically to modulate the signal away from low frequency (1/f) noise, thereby maximizing signal strength of tunneling, while increasing the detector's sweet spot and making it largely immune to processing variation, temperature changes, and other drift parameters. As illustrated in FIG. 6, resonant tunneling results in substantial increase in the signal 80 detected with respect to noise 82 and spurious signal 84. The signal 80 can be partially isolated from noise 82 and spurious signal 84. In one embodiment, modulation of a variable characteristic of the resonant tunneling device moves the signal (such as the signal 80) out of band to higher frequency (signal 86) away from the noise as illustrated arrow 88. This signal shift results in noise levels in the detector system that are comparable to less than $10 \, e/Hz^{1/2}$. Noise improvement by modulation of a variable characteristic of a resonant tunneling device enables single electron charge resolution at room temperature. Resonant tunneling is also an advantageous approach from a frequency range perspective since resonant tunneling devices are commonly used in multi-GHz circuitry and known to have RC time constants on the order of a picosecond.

Figure 7:
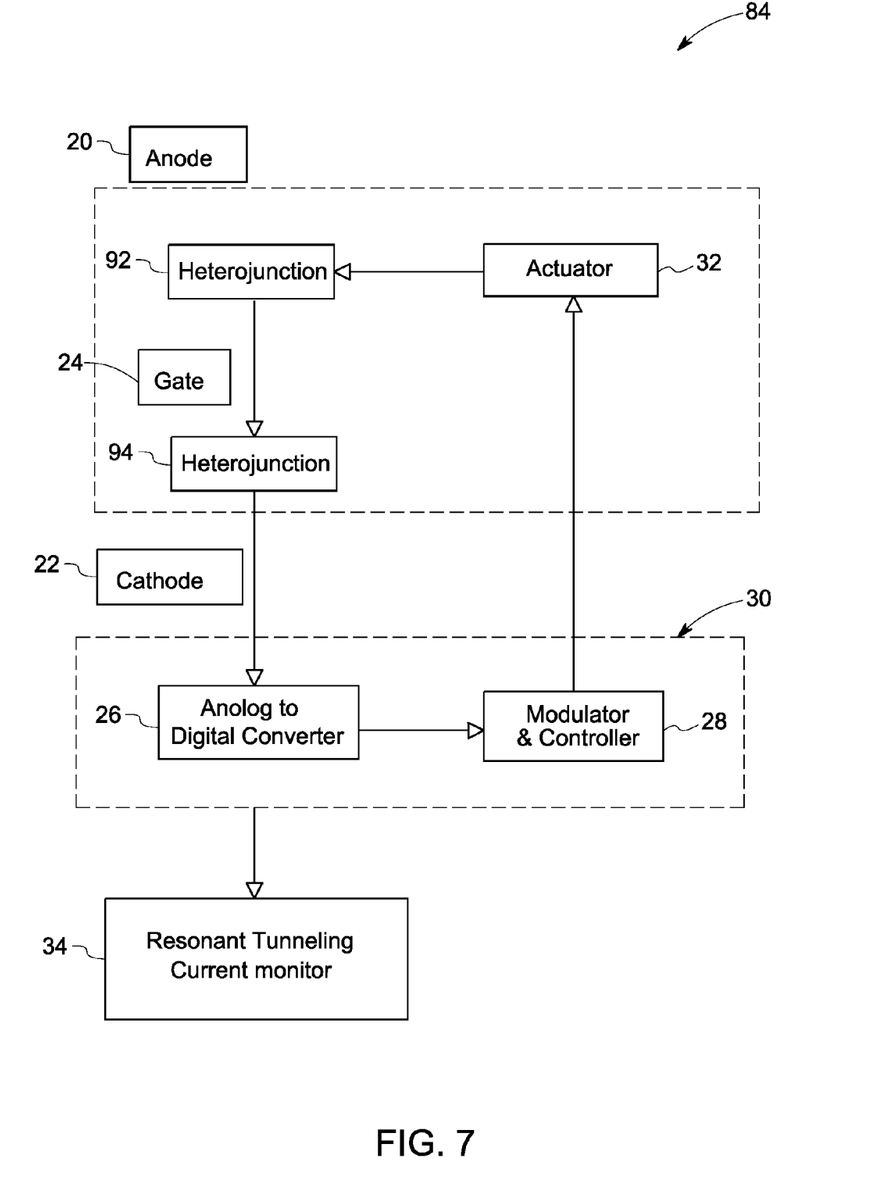
FIG. 7 is a schematic diagram representative of an example of a sensor assembly employing two heterojunctions, in accordance with embodiments of the present technique.

As illustrated in FIG. 7, the potential profiles required for resonant tunneling in the sensor assembly 90 may be realized in semiconductor systems of the hetero-junctions, such as hetero-junctions 92 and 94. The hetero-junctions 92 and 94 may utilize semiconductors of different types to create potential barriers or wells in the conduction band or the valence band. The layers comprising the hetero-junctions 92 and 94 may include low work function materials. The layers of the low work function materials form a quantum well for resonant tunneling. In one embodiment, the work functions of the layers of the heterojucntions may be in a range from about 0.75 eV to about 0.85 eV. Reducing the work function of the emitting material leads to an increase in field emission current density leading to more efficient tunneling device. Even a small reduction in the work functions may lead to a large increase in tunneling current density because the tunneling probability scales with the inverse exponential of the electrode work function.

In one embodiment, a method of selectively tuning the energy band in a quantum well heterostructure includes implanting ions into the heterostructure to form a disordered region, or varying thickness of one or more layers of the heterostructure. The vacancies and defects created by the implantation may be spatially separated from the quantum well active region. The heterostructure may be thermally annealed so that the vacancies diffuse through the active region (quantum wells) and enhance interdiffusion at the heterojunctions, thereby modifying the optical bandgap of the quantum well layers. The bandgap tuning is selective because the implantation step can be appropriately controlled. In another embodiment, the bandgap may be modulated by disposing piezoelectric material between the layers of the heterojunctions. The piezoelectric material may be used to vary the thickness of the layers of the heterojunctions.

Figure 8:
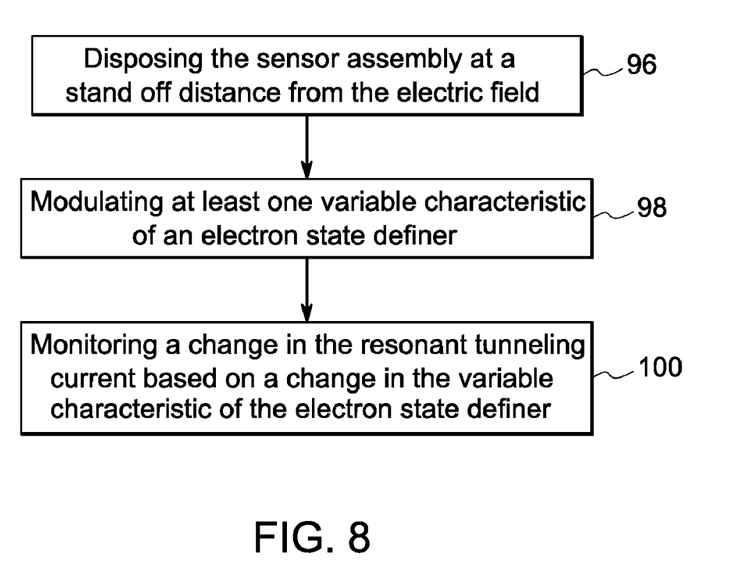
FIG. 8 is a flow chart for the steps involved in the method of detecting an electric field using a sensor assembly, in accordance with embodiments of the present technique.

In certain embodiments, a method for using the sensor assembly is provided. A method for sensing a parameter representative of an electrical field from a stand-off distance is provided. The method includes generating tunneling current in response to the electric field. The tunneling current may be generated and modulated using at least two electron state definers. The method includes disposing the sensor assembly at a stand-off distance from the source of the electric field and still induce a voltage between the electron state definers (block 96).

At block 98, a variable characteristic of at least one of the electron state definer is modulated. The tunneling current is modulated by varying at least one variable characteristic of the electron state definers. In one example where the electron state definer is a resonant tunneling device having a gap, the variable characteristic may include the gap distance, which can be modulated using acoustic actuation, a magnetic actuation, an electric actuation, a capacitive actuation, a piezoelectric actuation, a thermal actuation, or an actuation using shape memory alloy. In another embodiment, the variable characteristic may include a bias voltage applied to, for example, to a gate electrode.

In one embodiment, the tunneling current is modulated by actuating at least one of a first element and a second element of a gap. The step of actuating at least one of the first element and the second element may include monitoring a resistance characteristic corresponding to a spacing between the first element and the second element, and moving at least the first element and the second element until a determined resistance characteristic is achieved. The determined resistance characteristic may include a linear resistance characteristic indicative of ohmic conduction.

In one embodiment, the gap distance may be actively tuned using control feedback circuitry from the electronics to the drive potential on the sensor assembly. Alternatively, the gap may be modulated such that the frequency shifts the output of the sensor assembly to the modulating frequency. By synchronously demodulating and filtering of the amplified electronic signal, the low frequency noise may be reduced to desired levels. For electric fields at higher frequencies, in addition to very low thermal noise charge amplifiers, tunable band-pass filters may be used to band-limit the noise.

At block 100, a change in the resonant tunneling current is monitored while varying at least one variable characteristic of one of the electron state definers. In certain embodiments, the current flowing between the electron state definers is monitored and recorded over a period of time while varying the variable characteristic. Therefore, the monitoring provides a range of values representing the fluctuation of the current flowing between the electron state definers. These values may then be employed to arrive at the value of the existing electric field.

When resonant tunneling occurs in the presence of the electrical field, at specific values of the variable characteristic, a tunneling current flows between the electron state definers. The magnitude of the tunneling current depends on the electric field, the variable characteristic, and on the internal electronic band structure of the sensor assembly. The resulting resonant tunneling spectrum provides information on the value of the electric field.

Optionally, the method includes a step of transmitting data or results from the monitoring step (block 100) to a remote location. By "remote location" is meant a location other than the location at which the detection occurs. For example, a remote location could be another location (e.g. office, lab, etc.) in the same city, another location in a different city, another location in a different state, another location in a different country, etc. As such, when one item is indicated as being "remote" from another it means that the two items are at least in different buildings, and may be at least one mile, ten miles, or at least one hundred miles apart.

Further signal extraction may be achieved with a high-speed digitizer and subsequent digital signal processing. Calibration techniques to track and compensate for gain and offset drift with temperature and time may be incorporated into the sensor assembly/ASIC system. The compensation will be a combination of analog tracking and digital coefficient correction.

The stand-off electric field sensor of the present technique is adapted to sense electric fields over large frequency ranges while being compact and power efficient. The stand-off electric field sensor may be employed in a detector array to perform a high-sensitivity, low noise measurement of high bandwidth electric fields. Ultra low noise electronics combined with the stand-off sensor allows for the realization of physically dense detector arrays that have a high spatial resolution of electric field. Unlike traditional optic approaches using the electro-optic effect, the detector array having the stand-off electric field sensor provides a more compact device, that has extremely low wall power, and lower cost which could enable applications for individual soldiers. It is anticipated that advanced development efforts for sensitive, small form-factor, and low cost electric field sensors would result in a new approach that will enable longer-term continuous monitoring of electric fields. The advantages of using resonant tunneling include very high bandwidth, low noise capability, small, size and packaging, and high spatial resolution. These properties lead to further benefits such as arraying capability and wafer-level packaging.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A stand-off sensor assembly, comprising:
a plurality of electron state definers for generating resonant tunneling current in response to an electric field in a body, wherein at least one of the plurality of electron state definers comprises a tunable gap, wherein the electric field is being sensed by the sensor assembly at a distance from the body, without physical or electrical contact by the sensor with the body in which the electric field is being sensed, wherein the electron state definers comprise at least one variable characteristic such that a change in the variable characteristic affects the tunneling current; and
a monitor for monitoring a change in the tunneling current exiting an electron state definer based on a change in the variable characteristic of a tunneling device.

2. The stand-off sensor assembly of claim 1, wherein the gap is modulated to reduce inverse frequency (1/f) flicker noise effects on the sensing of the electric field by shifting the response of the sensor away from a spectral region comprising said flicker noise.

3. The stand-off sensor assembly of claim 1, wherein a gap distance is in a range from about 3 nm to about 10 nm.

4. The stand-off sensor assembly of claim 1, wherein the gap comprises a vacuum gap, a dielectric gap, a multilayer gap, or combinations thereof.

5. The stand-off sensor assembly of claim 4, wherein a plurality of layers of the multilayer gap comprises a metallic material, an insulating material, a fast ion conductor, a semiconductor material, or combinations thereof.

6. The stand-off sensor assembly of claim 4, wherein a plurality of layers of the multilayer gap comprises an amorphous material, or a crystalline material.

7. The stand-off sensor assembly of claim 4, wherein the multilayer gap comprises an emitter surface, a collector surface, or both an emitter surface and a collector surface.

8. The stand-off sensor assembly of claim 4, wherein the multilayer gap comprises a conducting intermediate layer.

9. The stand-off sensor assembly of claim 1, further comprising an actuator device that enables actuation to change the variable characteristic.

10. The stand-off sensor assembly of claim 9, wherein the actuator device is selected from the group consisting of an electrostatic actuator, a magnetic actuator, a thermal actuator, an acoustic actuator, a piezo-electric actuator, a shape memory alloy based actuator, or combinations thereof.

11. The stand-off sensor assembly of claim 1, wherein the variable characteristic comprises a distance between elements that define the gap.

12. The stand-off sensor assembly of claim 1, wherein at least one of the plurality of electron state definers comprise a two terminal device, or a three terminal device.

13. The stand-off sensor assembly of claim 12, wherein the two terminal device comprises a Schottky diode, metal/double-insulator/metal based tunneling diode, or combinations thereof.

14. The stand-off sensor assembly of claim 12, wherein the three terminal device comprises a high electron mobility transistors, MEMS-based device, or combinations thereof.

15. The stand-off sensor assembly of claim 1, wherein the monitor comprises one or more devices selected from the group consisting of an integrated detector with high accuracy current sensing, and ultra low noise electronics, an ultra-low noise charge sensitive integrator, high input impedance, a tunable bandwidth, low frequency noise reduction modulator, a demodulator, a precision reference and a control.

16. The stand-off sensor assembly of claim 1, wherein at least one of the plurality of electron state definers comprises a heterojunction device.

17. A system for sensing at a distance from a body a parameter representative of an electric field in the body, comprising:
a sensor assembly comprising:
a resonant tunneling device comprising a plurality of electron state definers to generate resonant tunneling current in response to the electric field, wherein at least one of the plurality of electron state definers comprises a tunable gap, wherein the resonant tunneling device comprises a variable characteristic, such that a change in the variable characteristic affects the tunneling current, wherein the electric field is sensed by the sensor assembly without physical or electrical contact by the sensor with the body in which the electric field is being sensed;
a monitor that monitors a change in the tunneling current exiting the resonant tunneling device based on a change in the variable characteristic of the tunneling device;
a modulator that modulates the variable characteristic of the resonant tunneling device; and
an actuator in communication with the modulator that enables the change in the variable characteristic of the resonant tunneling device.

18. The system of claim 17, wherein the actuator is an acoustic actuator, a magnetic actuator, an electric actuator, a capacitive actuator, a piezoelectric actuator, a thermal actuator, a shape memory alloy based actuator, or combinations thereof.

19. The system of claim 17, wherein at least one of the plurality of electron state definers comprises a heterojunction device.

20. A method for sensing with a sensor assembly at a stand-off distance from a body, a parameter representative of an electrical field in the body, comprising:
packaging in the sensor assembly a resonant tunneling device comprising a plurality of electron state definers;
non-invasively sensing the electric field by the sensor assembly without physical or electrical contact by the sensor into the body in which the electric field is being sensed;
generating a resonant tunneling current by way of the electron state definers in the resonant tunneling device in response to the electric field, wherein at least one of the plurality of electron state definers comprises a tunable gap;
modulating the tunneling current by varying at least one variable characteristic of the resonant tunneling device; and
monitoring a change in the tunneling current exiting the resonant tunneling device based on a change in the variable characteristic of the tunneling device to determine the parameter representative of the electrical field.

21. The method of claim 20, further comprising modulating the tunneling current by actuating at least one of a first element and a second element of the gap, wherein the modulating is adapted to reduce inverse frequency (1/f) flicker noise effects on the sensing of the electric field by shifting a response of the resonant tunneling device away from a spectral region comprising said flicker noise.

22. The method of claim 20, wherein the packaging comprises a wafer-level packaging.

23. A stand-off sensor assembly, comprising:
a plurality of electron state definers arranged to form a resonant tunneling device which generates resonant tunneling current in response to an electric field being sensed by the stand-off sensor assembly, wherein the electron state definers comprise at least one variable characteristic such that a change in the variable characteristic affects the tunneling current;
a monitor to monitor a change in the tunneling current exiting an electron state definer based on a change in the variable characteristic of the resonant tunneling device; and
an actuator coupled to the plurality of electron state definers to effect the change in the variable characteristic of the resonant tunneling device, wherein the actuator is adapted to cause a frequency shift in a response of the resonant tunneling device to the electric field from a first frequency region subject to a first signal-to-noise ratio to a second frequency region subject to a second signal-to-noise ratio, wherein a value of the second signal-to-noise ratio is higher than a value of the second signal-to-noise ratio.

24. A stand-off sensor assembly, comprising:
a plurality of electron state definers arranged to form a resonant tunneling device which generates resonant tunneling current in response to an electric field being sensed by the stand-off sensor assembly to at least measure a value of the electric field, wherein the electron state definers comprise at least one variable characteristic such that a change in the variable characteristic affects the tunneling current, wherein at least one of the plurality of electron state definers comprises a gap; and
an actuator coupled to the plurality of electron state definers to effect the change in the variable characteristic of the resonant tunneling device, wherein the actuator is adapted to modulate the gap to reduce inverse frequency (1/f) flicker noise effects on the measurement of the value of the electric field by shifting a response of the resonant tunneling device away from a spectral region comprising said flicker noise.

* * * * *